United States Patent
Defranco

(10) Patent No.: US 9,159,925 B2
(45) Date of Patent: Oct. 13, 2015

(54) PROCESS FOR IMPRINT PATTERNING MATERIALS IN THIN-FILM DEVICES

(71) Applicant: ORTHOGONAL, INC., Rochester, NY (US)

(72) Inventor: John Defranco, Ithaca, NY (US)

(73) Assignee: Orthogonal, Inc., Rochester, NY (US)

(*) Notice: Subject to any disclaimer, the term of this patent is extended or adjusted under 35 U.S.C. 154(b) by 0 days.

(21) Appl. No.: 14/357,835

(22) PCT Filed: Nov. 14, 2012

(86) PCT No.: PCT/US2012/065000
§ 371 (c)(1),
(2) Date: May 13, 2014

(87) PCT Pub. No.: WO2013/074617
PCT Pub. Date: May 23, 2013

(65) Prior Publication Data
US 2014/0329354 A1 Nov. 6, 2014

Related U.S. Application Data

(60) Provisional application No. 61/559,167, filed on Nov. 14, 2011.

(51) Int. Cl.
*H01L 51/00* (2006.01)
*H01L 51/56* (2006.01)
*H01L 51/44* (2006.01)

(52) U.S. Cl.
CPC ........ *H01L 51/0023* (2013.01); *H01L 51/0018* (2013.01); *H01L 51/44* (2013.01); *H01L 51/56* (2013.01); *H01L 2251/105* (2013.01)

(58) Field of Classification Search
CPC .......................................................... G03F 7/11
USPC ................................. 438/82, 49; 257/40, E21.04
See application file for complete search history.

(56) References Cited

U.S. PATENT DOCUMENTS

| | | | |
|---|---|---|---|
| 6,517,995 B1* | 2/2003 | Jacobson et al. | 430/320 |
| 7,142,179 B2 | 11/2006 | Miller et al. | |
| 7,202,179 B2 | 4/2007 | Taussig et al. | |
| 7,250,722 B2 | 7/2007 | Cok et al. | |
| 8,562,842 B2* | 10/2013 | Lee et al. | 216/11 |
| 2006/0279025 A1* | 12/2006 | Heidari et al. | 264/496 |

(Continued)

FOREIGN PATENT DOCUMENTS

| KR | 10-2008-0044436 A | 5/2005 | |
|---|---|---|---|
| WO | WO 2009/126916 A2 | 10/2009 | |
| WO | WO2009126916 * | 10/2009 | G03F 7/11 |

OTHER PUBLICATIONS

Christopher K. Ober "Orthogonal Processing:A New Strategy for Patterning Organic Electronics" Synergies in Nanoscale Manufacturing & Research Workshop Jan. 29, 2010.*

(Continued)

*Primary Examiner* — Yu-Hsi D Sun
*Assistant Examiner* — Chi-Hua Yang
(74) *Attorney, Agent, or Firm* — Merchant & Gould P.C.

(57) ABSTRACT

The present disclosure provides a method for patterning materials that are or are on top of chemically sensitive organic semiconductors. The method employs imprint lithography and a bilayer resist structure that simultaneously protects lower layers from harmful solvents and allows for cleaner liftoff by producing an undercut geometry to the resist pattern.

17 Claims, 3 Drawing Sheets

(56) References Cited

U.S. PATENT DOCUMENTS

| | | |
|---|---|---|
| 2007/0134362 A1* | 6/2007 | Heidari .................. 425/385 |
| 2007/0287270 A1 | 12/2007 | Li et al. |
| 2009/0057658 A1 | 3/2009 | Shin et al. |
| 2010/0289019 A1* | 11/2010 | Katz et al. .................. 257/40 |
| 2011/0147724 A1 | 6/2011 | Ha et al. |

OTHER PUBLICATIONS

Dae-Geun Choi, et al. "Fluorinated Organic-Inorganic Hybrid Mold as a New Stamp for Nanoimprint and Soft Lithography" Langmuir 2005, 21, 9390-9392.*

International Search Report for corresponding International Patent Application PCT/US2012/065000 mailed Mar. 28, 2013.

Zakhidov, A. et al. "Hydrofluorethers as Orthogonal Solvents for the Chemical Processing of Organic Electronic Materials", Adv. Mater., vol. 20, 2008, pp. 3481-3484.

Lee, J. et al. "Acid-Sensitive Semiperfluoroalkyl Resorcinarene: An Imaging Material for Organic Electronics", J. Am. Chem. Soc., vol. 130, 2008, pp. 11564-11565.

Taylor, P. et al. "Orthogonal Patterning of PEDOT:PSS for Organic Electronics using Hydrofluoroether Solvents", Adv. Mater., vol. 21, 2009, pp. 2314-2317.

* cited by examiner

PROCESS FOR IMPRINT PATTERNING MATERIALS IN THIN-FILM DEVICES This application is a National Stage Application of PCT/US2012/065000, filed 14 Nov. 2012, which claims benefit of U.S. Patent Application Ser. No. 61/559,167 filed on 14 Nov. 2011 and which applications are incorporated herein by reference. To the extent appropriate, a claim of priority is made to each of the above disclosed applications.

BACKGROUND OF PRIOR ART

The present disclosure describes a method for forming high resolution patterns using nanoimprint lithography on top of or using chemically sensitive organic electronic materials. More specifically, this disclosure details a method for patterning fine metal lines on top of organic semiconductors for making high-density organic memory chips.

Nanoimprint lithography (NIL) and related hard mask patterning techniques such as Flash and Repeat Nanoimprint Lithography (S-FIL) or Jet and Flash Imprint Lithography (J-FIL) are thin-film patterning techniques that utilize a hard mask or "stamp" to impress a structure on an underlying polymer material known as a resist. Once the stamp is pressed into the resist and released, the pattern of raised areas on the stamp are replicated in the resist. The resist pattern can be transferred into the underlying material using an etch process before the resist is removed from the substrate using a stripping process, usually involving an oxygen plasma etch.

Imprint lithography is a very high-resolution technique because it doesn't suffer from the diffraction limitations of photolithography. The stamp can be made using a slower, high-resolution technique such as ebeam lithography, which limits the features to 10 nm or less, making it an attractive future lithography technique for high resolution patterning for memory and integrated circuits.

Liftoff is another process that is possible with imprint lithography, whereby a resist layer is imprinted, excess resist is removed with an etch process (descum), a material such as metal is deposited on the patterned substrate, and the resist is removed, leaving material in the "holes" of the original imprint pattern. This process is particularly good for patterning metals that do not have a favorable etch chemistry available, such as platinum.

This liftoff technique does not work well for patterning, or patterning on top of, chemically sensitive materials such as organic semiconductors. These materials, used in devices such as Organic Light Emitting Diodes (OLED), Organic Thin-Film Transistors (OTFT) or Organic Memory (OMEM), have need for high resolution patterning of both the semiconductors themselves (for example in high-resolution OLED pixels), or of other materials such as metals on top of these layers (e.g. source/drain electrodes for OTFTs and top electrodes for OMEM). The reasons for this limitation are the harsh solvents used for removing the resist during liftoff and the need for a descum step, which would limit the use of the liftoff process on top of the chemically sensitive materials.

Various devices are known that employ patterned organic materials aligned to features or structures on a substrate. These devices are often considered to have the potential for low cost since organic materials are typically less expensive than inorganic materials and these organic materials can be rapidly blanket coated over large substrates, permitting the formation of large, low cost devices. One example of such a device is a display employing Organic Light Emitting Diodes (OLEDs). Besides providing the potential for low cost, these displays have the potential to produce light much more efficiently and with higher visual quality than most competitive display technologies. Therefore, OLED displays have the potential to displace LCD and plasma displays in many markets. This OLED technology can additionally be employed in other devices, including lamps with adjustable color. Similar device structures can be employed using organic semiconductors to form organic photovoltaic devices, organic memory devices and organic electrical components; such as Organic Thin Film Transistors (OTFTs).

Unfortunately, OLED technology, particularly OLED display technology, has been adopted slowly. This slow adoption rate stems at least partially from the high cost of patterning these materials to form a practical display device. Various approaches to patterning organic materials to form full color OLED displays have been attempted. Patterning of different colors of material by vapor deposition of organic materials through shadow masks has proven to be effective. However these shadow masks limit the resolution of the displays, the size of the substrate that can be successfully coated, and increase the TACT time. Other approaches, such as the use of laser deposition to pattern color emitters has been demonstrated but this technology often produces displays with low yields and often results in significant residual waste. Solution printing of different colored organic emitters has also been discussed but these processes typically result in emitters with significantly lower emission efficiency as compared to emitters deposited by vapor deposition. This lower efficiency is due to increased contact resistance and the fact that polymeric materials, that are often used, often have a lower luminescent efficiency and lifetime than small molecule materials and the use of solution deposition limits the number of layers that can be deposited on one another to manage the movement of carriers through the organic layer. Other approaches to forming multicolor OLED devices have also been attempted, including the use of white emitters together with patterned color filters. However, these approaches also reduce the effective efficiency of the emitters within the OLED display. Other organic devices, including OTFTs, suffer from similar patterning issues.

One approach to avoid detailed patterning of organic materials is to adopt OLED display structures including one or blanket-coated emitting layers. For example, Miller et al in U.S. Pat. No. 7,142,179, entitled "OLED display device", issued on Nov. 26, 2006 and Cok et al in U.S. Pat. No. 7,250,722, entitled "OLED device", issued on Jul. 31, 2007, each discuss a structure having a first OLED constructed between a first and a second patterned electrode and a second OLED constructed between the second patterned electrode and a blanket-coated electrode. Within each of these documents, the first OLED must be patterned to permit the second pattern electrode to be connected to the substrate. Further the second electrode must be patterned after it is deposited over the OLED. These structures produce higher efficiency light output without patterning at least one of the layers of organic materials. However, these structures require the patterning of very small structures through an organic layer to form a via hole through the organic material, as well as the patterning of a conductive layer over an organic layer. Robust processes for providing these vias and forming the electrode pattern over an organic layer in a high speed manufacturing environment are not known in the art and therefore these device structures have not been successfully manufactured. Similar structures are also desirable for the formation of multi-layer photovoltaic and other organic devices.

In inorganic electronic devices, it is known to apply photolithographic techniques to pattern multiple thin film layers of inorganic semiconductors and inorganic electrically conductive layers with high resolution over large substrates for forming arrays of electrical components. Unfortunately, the photolithographic materials and solvents applied to form these devices are known to dissolve organic materials. Therefore, it is not possible to apply the photolithographic materials and solvents that are known to be used to manufacture inorganic solid state circuits to pattern layers of organic material, especially layers that include active semiconductor organic materials or layers that are formed on top of organic materials.

Recently photoresist materials and solvents have been discussed in the art to facilitate the use of photolithographic techniques to pattern polymeric organic semiconducting layers. For example, Zakhidov et al. in an article published in Advanced Materials in 2008 on pages 3481-3484 and entitled "Hydrofluoroethers as Orthogonal Solvents for the Chemical Processing of Organic Electronic Materials" discusses a method for patterning polymer organic material in which a fluorinated photoresist is deposited on a substrate, selectively exposed to an energy source to change the solubility of a portion of the photoresist, the photoresist is developed in a solvent including hydrofluroether to develop the pattern and remove the portion of the photoresist material that was not exposed. The solubility of the cross-linked photoresist in a hydrofluroether was then reestablished through the use of another solvent. An active organic semiconductor was then deposited over the remaining photoresist and remaining photoresist was lifted off to pattern the active organic semiconductor. As such, this paper demonstrates the patterning of a single solution-coated, polymeric, organic semiconductor on a substrate. The same general process has been discussed by Lee et al. in an article published in the Journal of the American Chemical Society in 2008 on pages 11564 through 11565 and entitled "Acid-Sensitive Semiperfluoroalkyl Resorcinarene: An Imaging Material for Organic Electronics".

Taylor et al. in an article published in Advanced Materials on Mar. 19, 2009 on pages 2314-2317 and entitled "Orthogonal Patterning of PEDOT:PSS for Organic Electronics using Hydrofluoroether Solvents" discusses the formation of a bottom contact thin film transistor in which a polymeric organic conductor (i.e., PEDOT:PSS) is formed on a substrate, a photoresist is formed and patterned over the conductor, the conductor is etched, a second photoresist is applied and patterned before an organic semiconductor (e.g., pentacene) is applied and patterned.

Each of these papers discuss patterning of solution-coated, polymeric organic materials using a modified photolithographic process and materials to create components in an electrical circuit, the use of processes and materials such as these have not been applied to OLED devices. Further, these papers discuss the application of these materials and processes for use with polymers and do not provide a method for patterning layers of small molecule organic materials. Further, according to this method, it is necessary to perform multiple photo-patterning steps, specifically one photo-patterning step for each patterned layer, to create patterns in multiple layers including at least one organic layer and a layer deposited over this organic layer, such as an electrical conductor. Certain photolithographic process steps, including the exposure of the photolithographic materials to radiation to perform the photo-patterning step, are typically performed in air. Unfortunately, air contains oxygen and moisture with which the organic materials can react. Therefore, performing multilayer photo-patterning of organic devices by forming multiple layers of photo-patternable materials, some being formed over the organic layers can result in devices with degraded performance. Further, each of these photolithographic steps are quite expensive to perform and require one full photolithographic step, including deposition of the photo-patternable material, as well as, exposure, development and liftoff of the pattern for each layer within the device.

In another approach, Katz and Dhar in International Publication Number WO 2009/126916, entitled "Patterning devices using fluorinated compounds" filed Apr. 10, 2009 discuss forming an active layer to be patterned on a substrate, providing a barrier layer of fluorinated material over the active layer, forming a photo-patternable layer over the fluorinated layer and exposing the photo-patternable to radiation within a process that permits the active layer to be patterned. However, this approach requires the deposition of multiple layers to pattern a single active layer.

In another approach, Taussig et al in U.S. Pat. No. 7,202,179 entitled "Method of forming at least one thin film device", issued on Apr. 10, 2007 discusses a method in which a 3D template is used to emboss a 3D structure over the layers of a device and the 3D structure and the underlying layers are etched to provide the final structure. This method permits different patterns to be formed in different layers of a device as the result of using a single imprint lithographic step so that alignment of multiple lithographic steps is not required, permitting this method to be applied to form devices on substrates that are not stable, for example, plastics which expand or contract during manufacturing. Unfortunately, the method provided is only useful with inorganic structures as the method applies materials and methods that are not compatible with organic semiconductor materials. Further, the method applies techniques that are not currently used in high volume manufacturing and requires strict process control to permit the patterning steps to achieve the desired result.

There is, therefore a need for a method that permits the formation of a first pattern in an organic material layer and at least a second, different pattern in a separate active material layer formed over the organic layer. This process should be robust, permit the formation of patterns at near micron resolution and not require the organic materials to be exposed to air during development. It is especially desirable that this method be compatible with vapor deposited, small molecule organic materials. Ideally, this same method would also be compatible with non-organic devices to permit multiple layers within these devices to be differently patterned in response to a single photolithographic step.

SUMMARY

The present disclosure describes a method for high resolution patterning of a conductive layer over an organic semiconductor layer within an organic electronics device using a bilayer imprint patterning method. This method includes first providing a substrate and depositing organic and inorganic materials over the substrate with the top layer being an organic layer. A layer of perfluorinated or semi-perfluorinated polymer is coated on top of the organic layer, using non-damaging fluorous solvent, forming a protective coating. A second layer of imprintable thermoplastic or photo-curable resin, of the type typically used in nanoimprint lithography, is then coated onto the fluorinated polymer layer. An imprint stamp with a raised pattern is brought into contact with the multi-layer stack and pressed into it so that the raised features of the stamp penetrate through the top layer of the bilayer stack (fluorinated polymer plus imprint resist layer) and into the fluorinated layer. Once the stamp is removed from the substrate, the substrate is rinsed with a fluorous solvent, to remove the material from the bottom of the imprinted areas and creating a slight undercut profile in the bilayer stack. An evaporated layer, such as a metal is then deposited onto the wafer. A fluorous solvent can then be used to lift the bilayer stack off of the substrate, leaving a patterned layer on top of the organic material.

DETAILED DESCRIPTION

The present disclosure describes a method for forming an organic device on a substrate with a patterned layer formed by an imprint process, where the organic device includes an active organic layer formed between the substrate and the patterned conductive layer. Specifically, a resist bilayer is formed on top of the organic layer, which may or may not have been patterned by a previous process, and this layer is imprinted with a rigid stamp with raised areas. The bilayer consists of a top layer that is a material typically used for imprint lithography processes, and a bottom layer that serves as a buffer layer for the underlying organic material and a sacrificial layer for the end of the process. The resulting relief pattern extends through the top imprint layer and into the buffer layer beneath it in the bilayer, but stops before reaching the organic layer. After the stamp is removed, a fluorous solvent is used to etch away the remaining fluorinated layer at the bottom of the imprint pattern as well as some of the material underneath the top resist layer, creating an undercut profile. A film is then deposited, with material landing in the imprinted area contacting the organic layer, while the resist lands on the resist bilayer. A non-damaging solvent is used to lift off the bilayer, leaving only the deposited material that landed on the organic layer.

Figure 1:
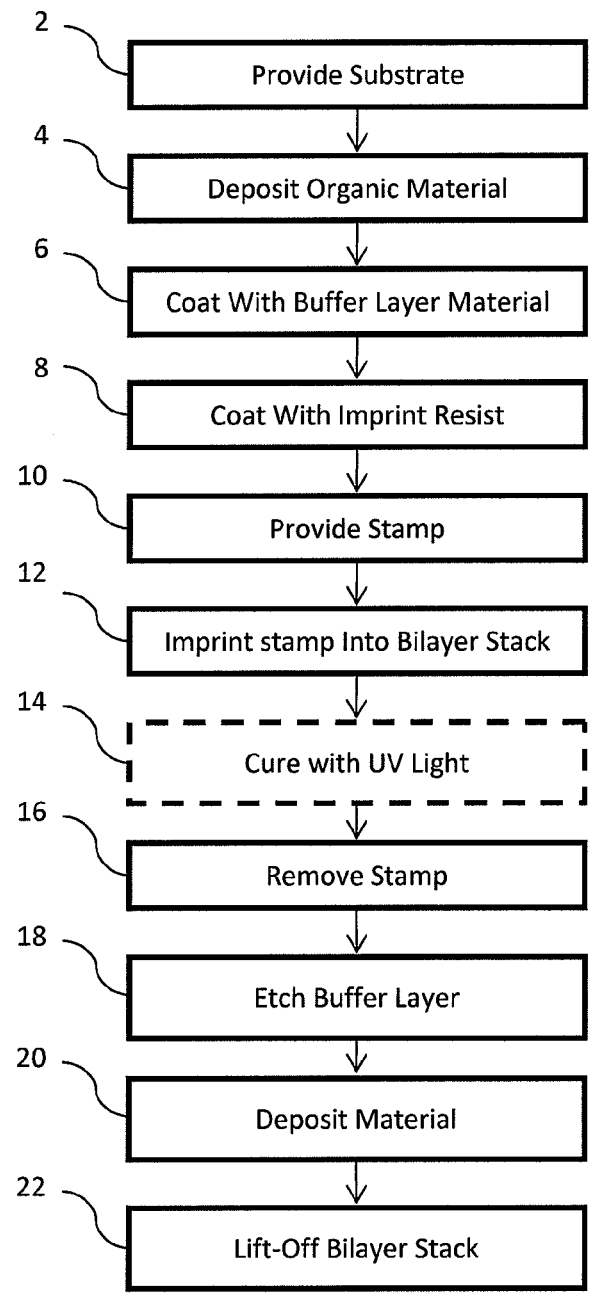
FIG. 1 flow diagram depicting the steps of one embodiment of the present invention.
Figure 2:
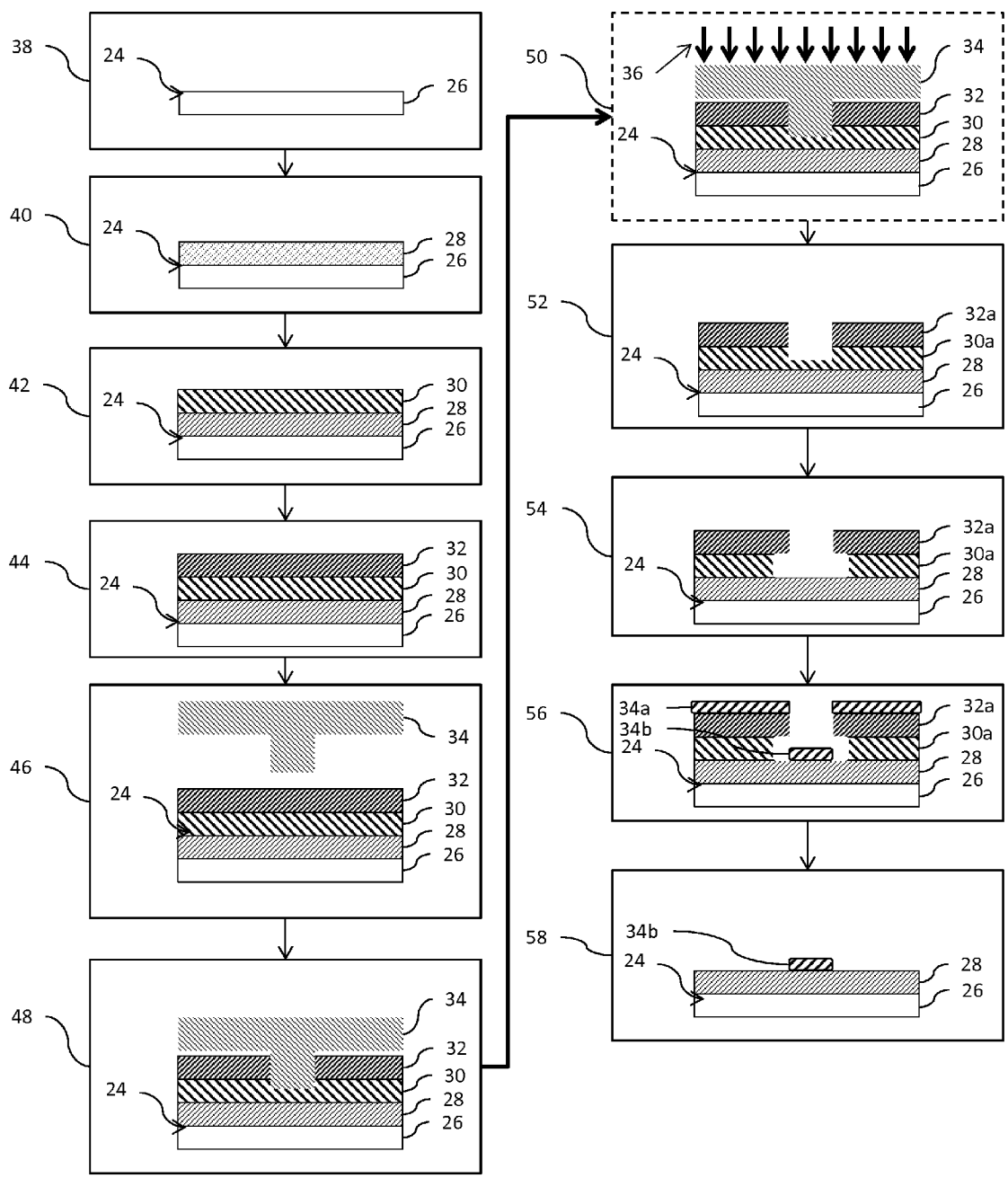
FIG. 2 process diagram depicting the various stages of the development of a device formed using one embodiment of the method of the present invention.

One embodiment of a method of the present invention for forming an organic device having a patterned conductive layer in contact with and over at least a portion of an organic layer is depicted in the flow diagram of FIG. 1. FIG. 2 accompanies FIG. 1 and shows an organic device 24, specifically portions of an organic memory element, at various stages of development during this process. Within this method, the conductive layer is deposited over an organic layer such that it is in electrical contact with at least a portion of the organic layer and then patterned. As shown in FIG. 1, this method includes first providing 2 a substrate 26 as shown at stage 38 in FIG. 2. One or more layers of organic semiconductor material, is then deposited 4 over the substrate 26 to form one or more organic layers 28. As shown at stage 40 of FIG. 2, this forms a uniform layer of the organic layers over the substrate 26 within the active area of the device.

A fluorinated layer is coated 6 on the organic layers 28, as is shown in process diagram 42 to form fluorinated sacrificial layer 30. This layer is deposited with a solvent that is non-damaging to the underlying organic layers 28, in this embodiment with a fluorous solvent such as a hydrofluoroether (HFE), although this solvent class is not the only one that can be used for this process. The coating process can include spin coating, dip coating, doctor blading, slit coating or a vacuum deposition process. On top of layer 30, an imprint resist is coated 8, forming layer 32 as is shown in diagram 44 of FIG. 2.

A stamp is provided 10, that is made of a rigid or semi-rigid material, with raised features defining the desired pattern on the substrate, as shown in FIG. 2 46. The stamp can be made of a variety of materials, including, but not limited to, silicon, glass, PFPE, PDMS or metal. The stamp may be transparent or opaque, with the former being necessary for the UV cure step 14. The stamp may also contain opaque and transparent elements, for example, having chromium metal coating the end of the relief feature so that the UV cure step does not affect the imprinted areas.

The stamp is imprinted into the bilayer stack 12, shown in the diagram 48. The depth of the imprint is important, as the stamp needs to pass through the top layer 32 into the buffer layer 30, but not go through that layer into the organic layers 28. The depth of imprinting can be controlled by the height of the relief features and the action of the imprinting tool (not shown) that raises the substrate or lowers the stamp a controlled distance.

A UV curing step 14 is optional and is dependent on the composition and properties of both the imprint resist layer 32 and the buffer layer 30. In many cases, an imprint resist is a UV-cured resin that is cross-linked upon exposure to UV radiation. In this way it can go from a low viscosity state, necessary to let it flow around the stamp, to a high viscosity state, to allow it to how the embossed shape once the stamp is removed. Another method is a thermally induced viscosity change, although the temperature swings may be too extreme for many organic materials or plastic substrates. Although UV can harm organic materials as well, an absorbing material such as a dye may be added to the buffer layer 30 to prevent penetration of a large amount of UV radiation. It is not necessary for the buffer layer 30 to be UV sensitive. However, UV sensitivity may be used to change the properties of the buffer layer to control its solubility in the subsequent etching with solvent. The change in materials properties of the two bilayer materials is shown in the diagram 52 in FIG. 2. The stamp is removed from the substrate 16, leaving the imprinted layers on top of the organic layers 28. The layers have now been optionally UV irradiated and are labeled as the irradiated buffer layer 30a and the irradiated imprint layer 32a. Next a non-damaging solvent such as a fluorous solvent is used to etch the buffer layer 18. The removal and resulting undercut profile are shown 54. The amount of undercut must be large enough to make a discontinuous film upon deposition, but not so much that adjacent features are connected through a tunnel, undermining the stability of the imprint resist film and causing feature collapse.

Material is deposited 20 onto the device 24, as shown in the diagram 56. Material that lands on top of the remaining bilayer structure 34a is physically disconnected from material 34b that contacts the organic layers 28. After the removal of the buffer layer material in the previous step 18, the deposited layer 34b can make a clean and intimate contact with the organic layers 28. The bilayer is stripped or lifted off 22 with a non-damaging solvent, which dissolves or swells the buffer layer 30, while leaving the organic layers 28 unharmed. The portion of the deposited film 34a that landed on top of the bilayer is removed, leaving a patterned layer on the organic layers 28. More layers or processing may be needed to complete the device 24, which may be accomplished by this or any other method.

Within the present disclosure, the term "substrate" refers to any support on which organic materials can be coated to provide structural integrity. Substrates known in the art include rigid substrates, such as those typically formed from glass, and flexible substrates, such as typically formed from stainless steel foil or plastic. The substrate 26 can also provide a portion of an environmental barrier to protect the organic material from moisture or oxygen, but this is not required. The substrate 26 can be opaque, transparent or semitransparent. The substrate 26 can further include one or more inorganic layers, such as metal buss lines or inorganic semiconductor materials for conducting electricity to the organic device. The substrate 26 can include nonconductive layers of organic material to perform functions, such as insulating the active organic layer from conductive elements on the substrate or smoothing the surface of the substrate to permit a uniform layer of active organic materials 28 to be formed.

The term "organic layer" in the present disclosure refers to a layer of organic chemical compounds that provide an active electrical function. The organic materials from which the organic layers 28 will be formed will commonly be semiconductors and will typically be formed in one or more thin layers, often less than 50 nm in thickness. These organic materials can be small molecule organic materials, monomers, polymers or mixtures of these materials. Within some preferred embodiments of the present invention, these organic materials will be blanket coated. That is they will be deposited to uniformly coat a single large area of the substrate 22 to form the organic layer 28. However, this is not required and in some embodiments, these materials can be patterned on the substrate 26 as they are deposited forming an organic layer 28 that is discontinuous across the surface of the substrate 26. In a preferred embodiment, it is desirable for the last active organic material to be deposited before coating 6 the buffer layer or coating 20 the conductive layer to contain polymer strands to provide stability to the organic layer.

As such, the step of depositing organic materials over the substrate includes depositing at least one polymeric organic material and the buffer layer is coated directly on top of the at least one polymeric organic material. By providing an active electrical function, the organic material serves to conduct electricity, serves as a semiconductor to control the flow of electricity, or serves as an insulator to prevent or reduce the flow of electricity.

Figure 3:
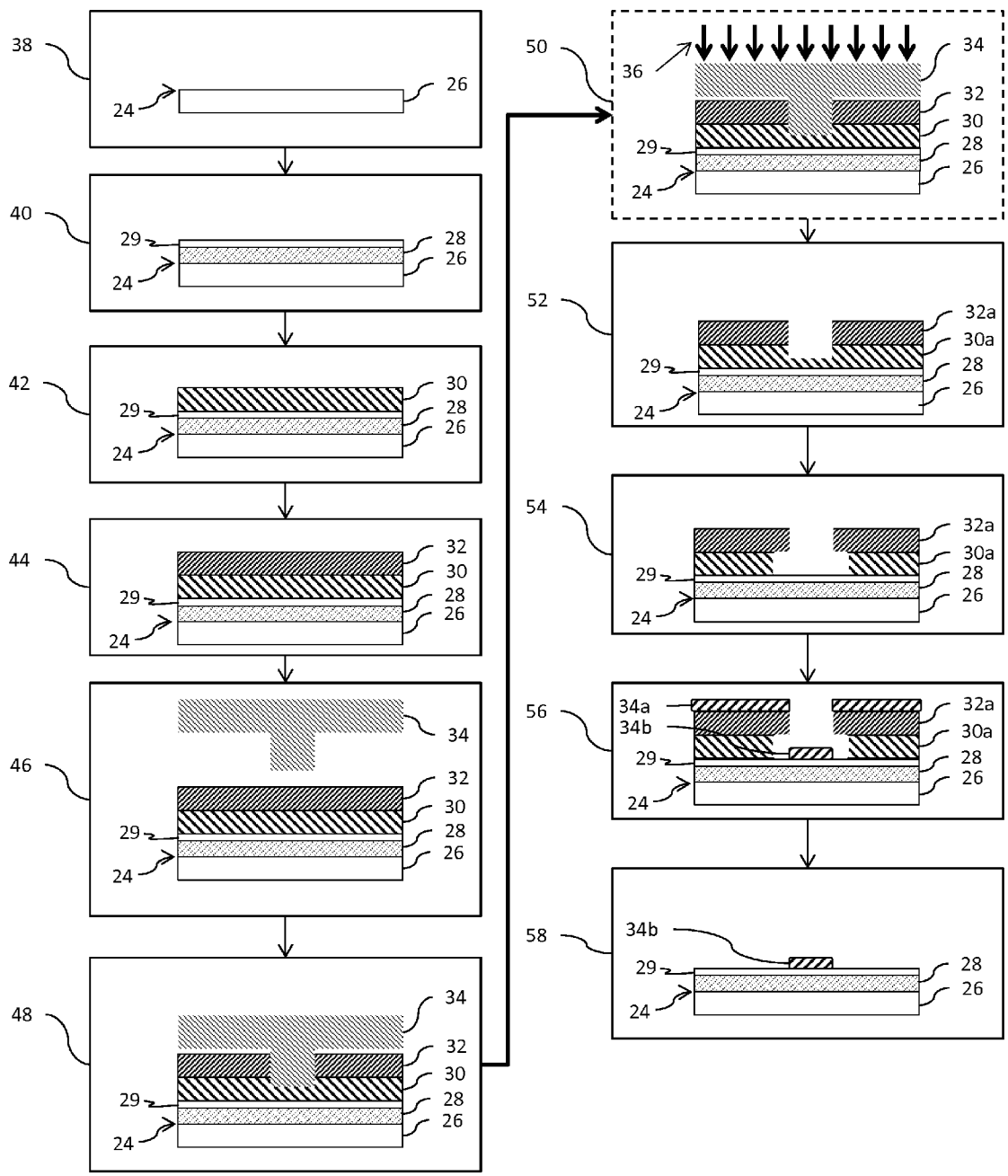
FIG. 3 process diagram depicting the various stages of the development of a device formed using another embodiment of the method of the present invention.

In examples described in the present disclosure a buffer layer 30 and imprint layer 32 is coated "over" the one or more organic layers to form an imprint patternable layer. The term "over" is defined such that an organic layer is deposited on the substrate prior to coating the photo-patternable layer. In some embodiments, the photo-patternable layer will be coated immediately on top of one or more organic layers. In another embodiment, one or more organic layers will be deposited and a patterned inorganic layer will be created over the organic layer, covering a portion of the organic layer and the photoresist solution will be coated such that it is in direct contact with a portion of the organic layer, without having any intermediate inorganic layer. In further embodiments, such as the one shown in FIG. 3, an inorganic layer (29 in FIG. 3) is formed over the organic layer before applying the buffer layer 30. The steps and layers of FIG. 3 are otherwise the same as described previously for FIG. 2. Although it is possible that the inorganic layer could provide protection to the organic layer, in practical devices voids within the inorganic layer will often prevent such an inorganic layer from providing effective protection to the organic layer from the buffer material solution. Therefore, in some embodiments it is important to use the fluorinated buffer material and solvents described in the present disclosure to achieve high yield even in circumstances where the organic layer is deposited onto the substrate prior to exposing the substrate to a buffer material solution even when the organic layer is somewhat protected by an intervening inorganic layer.

The terms "buffer layer" and "buffer material" mean a material that is both safe to use on top of the organic layers 28, and that can further provide protection from the solvents used to deposit and process the imprint resist layer on top. In one embodiment, a fluorinated polymer material is used as a buffer layer, cast with a solvent such as a hydrofluoroether (HFE), such as Novec 7600 or Novec 7500 from 3M Corp. The polymer may be composed of a single fluorinated monomer or be a mixture of one or more fluorinated and non-fluorinated co-monomers. The ratio of fluorinated to non-fluorinated monomers can be used to control the adhesion properties of the buffer layer 30 to the organic layers 28 surface and of the adhesion of the imprint resist 32 to the buffer layer 30. A photosensitive element may be incorporated into the buffer layer material, which renders it less soluble to the etching solvent. Such a property may be found using deprotection scheme found in some photoresist systems.

The term "imprint layer" refers to materials commonly used in imprint lithography. These materials typically fall into two broad categories: thermoplastic polymers and UV-curable resins.

The deposited material can be a conductive layer, an organic layer or an inorganic semiconductor or insulating layer. The preferred embodiment is to deposit a conductive layer in step 20 in order to make a device such as a memory element or a top-contact organic transistor.

The term "conductive layer" refers to layer or a combination of multiple thin film layers formed after an organic layer, wherein the layer or combination of thin film layers functionally provide a single conductive element which is capable of creating an electrical field within the organic layer. The conductive layer can be transparent, semi-transparent, or opaque. Typical conductive layers useful in embodiments of the present invention will have a thickness of between 10 nm to permit the formation of a continuous film and less than 300 nm to permit the film to be permeated by the solvents described in the present disclosure. This conductive layer can be formed from organic or inorganic materials capable of providing electricity to the organic semiconductor layers. However, in some preferred embodiments of the present invention, these conductive layers will include an inorganic metal. This inorganic metal will preferably be applied through vapor deposition or sputtering.

Typical inorganic materials useful in forming such a conductive layer will include metals such as silver, gold, platinum, copper and aluminum; as well as certain doped metal oxides, such as indium tin oxide or indium zinc oxide. Once again, conductive layers can be formed using multiple methods including printing or sputtering. However, as discussed earlier, it can be desirable in certain embodiments to deposit the inorganic conductive layers using evaporation or other methods that provide line of sight deposition.

LIST OF REFERENCE LABELS IN THE DRAWINGS 2 providing substrate step
4 deposit organic semiconductor material step
6 coat buffer layer step
8 coat imprint resist step
10 providing stamp step
12 imprinting into bilayer step
14 (optional) UV curing step
16 removing stamp step
18 etch buffer layer step
20 depositing material step 22 liftoff of bilayer step
24 organic device
26 substrate
28 one or more organic layers
30 buffer layer
30a exposed buffer layer
32 imprint resist layer
32a exposed imprint resist
34a deposited material on bilayer
34b deposited material on organic layer
38 substrate stage
40 organic-coated substrate stage
42 buffer layer-coated substrate stage
44 imprint resist-coated substrate stage
46 stamp and substrate stage
48 stamp imprinting stage
50 (optional) UV cure stage
52 imprinted bilayer stage
54 etched buffer layer stage
56 deposited material stage
58 completed stage

What is claimed is:

1. A method for forming an organic device having a patterned material layer, comprising:
   a) providing a substrate;
   b) depositing one or more organic materials over the substrate to form one or more organic layers having an active electrical function, and optionally depositing an intermediate inorganic layer over the one or more organic layers;
   c) forming an imprint-patternable bilayer including a buffer layer provided over the one or more organic layers and optional intermediate inorganic layer, and an imprint resist layer provided over the buffer layer;
   d) forming an imprint pattern in the imprint-patternable bilayer using a stamp with raised regions that pass through the imprint resist layer and into the buffer layer;
   e) etching the buffer layer with an etchant that is chemically orthogonal to the top layer, thereby undercutting the imprint resist layer in a controlled manner and exposing a top surface of the one or more organic layers or optional intermediate inorganic layer in a pattern corresponding to the imprint pattern;
   f) depositing a material onto the imprint resist layer and the exposed top surface of the one or more organic layers or optional intermediate inorganic layer; and
   g) lifting off the imprint resist layer and material deposited over the imprint resist layer with a solvent that dissolves or swells the buffer layer, leaving behind a patterned layer of material deposited over the top surface of the one or more organic layers or optional intermediate inorganic layer.

2. The method of claim 1 wherein the buffer layer comprises a perfluorinated or semi-fluorinated polymer.

3. The method of claim 2 wherein the buffer layer is deposited from a solution including a fluorinated solvent.

4. The method of claim 3 wherein the fluorinated solvent is a hydrofluoroether.

5. The method of claim 1 wherein the etchant used to etch the buffer layer is a fluorinated solvent.

6. The method of claim 5 wherein the fluorinated solvent is a hydrofluoroether.

7. The method of claim 1 wherein the solvent used to lift off the imprint resist layer is a fluorinated solvent.

8. The method of claim 7 wherein the fluorinated solvent is a hydrofluoroether.

9. The method of claim 1 wherein one or more organic materials is a semiconductor.

10. The method of claim 1 wherein one or more organic materials is a vapor deposited small molecule material.

11. The method of claim 1 wherein the raised regions of the stamp do not pass into the one or more organic layers.

12. The method of claim 1 wherein the imprint resist is a UV-curable resin and further comprises the step of UV-curing during pattern imprint.

13. The method of claim 12 wherein the buffer layer includes a photosensitive element.

14. The method of claim 1 wherein the patterned layer of material is a conducting material.

15. The method of claim 14 wherein the conducting material is a metal.

16. The method of claim 1 wherein the patterned layer of material is a semiconductor.

17. The method of claim 1 wherein there is no intermediate inorganic layer and the buffer layer is provided in direct contact with the one or more organic layers.

* * * * *